(12) United States Patent
Wang et al.

(10) Patent No.: US 8,541,939 B2
(45) Date of Patent: Sep. 24, 2013

(54) ORGANIC LIGHT EMITTING DIODE DISPLAY DEVICE AND MANUFACTURING METHOD THEREOF

(75) Inventors: Wen-Chun Wang, Taichung (TW); Chun-Chin Chang, Tanzih Township, Taichung County (TW); Sherry Lin, Pingtung (TW)

(73) Assignee: Wintek Corporation, Taichung (TW)

( * ) Notice: Subject to any disclaimer, the term of this patent is extended or adjusted under 35 U.S.C. 154(b) by 1008 days.

(21) Appl. No.: 12/582,917

(22) Filed: Oct. 21, 2009

(65) Prior Publication Data

US 2010/0097303 A1  Apr. 22, 2010

Related U.S. Application Data

(60) Provisional application No. 61/107,411, filed on Oct. 22, 2008.

(51) Int. Cl.
*H01L 51/00* (2006.01)

(52) U.S. Cl.
USPC .............................. 313/503; 313/512; 445/25

(58) Field of Classification Search
USPC .............................. 313/498–512; 445/24–25
See application file for complete search history.

(56) References Cited

U.S. PATENT DOCUMENTS

| | | | |
|---|---|---|---|
| 6,175,345 B1 * | 1/2001 | Kuribayashi et al. ........... | 345/76 |
| 7,345,422 B2 | 3/2008 | Kim | |
| 2001/0026127 A1 * | 10/2001 | Yoneda et al. ................. | 313/506 |
| 2005/0179368 A1 * | 8/2005 | Ryu et al. ...................... | 313/504 |

FOREIGN PATENT DOCUMENTS

| | | |
|---|---|---|
| TW | 514751 | 12/2002 |
| TW | 200808119 | 2/2008 |

OTHER PUBLICATIONS

Taiwanese language office action dated Sep. 13, 2012.
English language translation of abstract of TW 514751 (published Dec. 21, 2002).
English language translation of abstract of TW 200808119 (published Feb. 1, 2008).

* cited by examiner

*Primary Examiner* — Anne Hines
(74) *Attorney, Agent, or Firm* — McClure, Qualey & Rodack, LLP

(57) ABSTRACT

An organic light emitting diode (OLED) display device including an active array structure, a display structure and several conductive members is provided. The active array structure includes a first substrate and several thin film transistors. The thin film transistors disposed on the first substrate has several drains. The display structure includes a second substrate, a color changing medium, a first electrode layer, an organic material layer and a second electrode layer disposed sequentially. The location of the second substrate corresponds to that of the first substrate. The color changing medium has several color blocks. The organic material layer is used for emitting blue light and includes several lighting structures electrically insulated from each other. The second electrode layer includes several electrode structures electrically insulated from each other. Each of the conductive members is combined and electrically connected to the drain of each thin film transistor and each electrode structure.

20 Claims, 4 Drawing Sheets

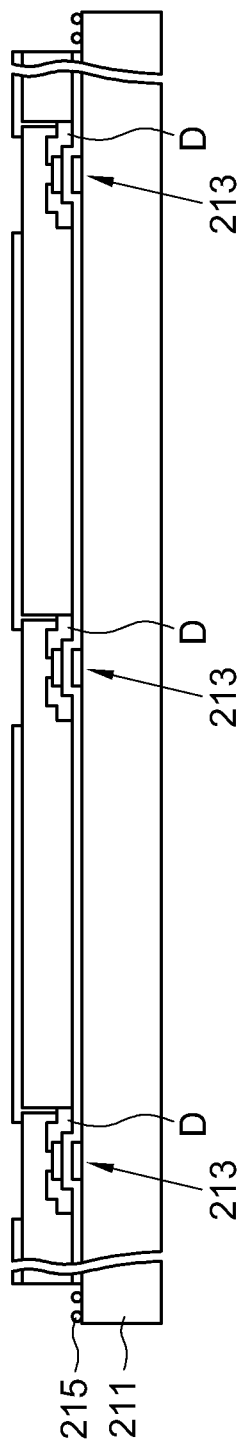
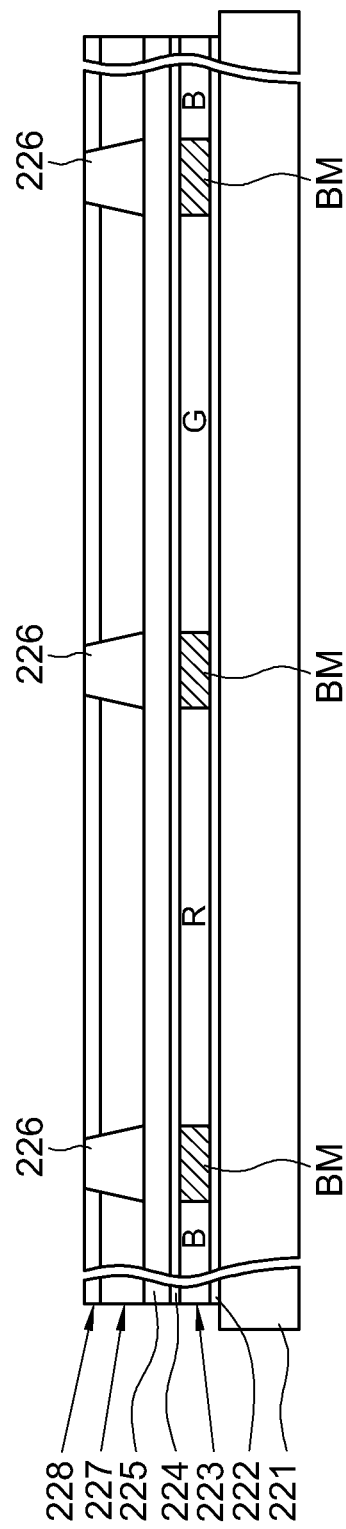

ORGANIC LIGHT EMITTING DIODE DISPLAY DEVICE AND MANUFACTURING METHOD THEREOF

This application claims the benefit of U.S. Provisional Application No. 61/107,411, filed Oct. 22, 2008, the subject matter of which is incorporated herein by reference.

BACKGROUND OF THE INVENTION

1. Field of the Invention

The invention relates in general to a display device, and more particularly to an OLED display device having two substrates and a manufacturing method thereof.

2. Description of the Related Art

Organic light emitting diode (OLED) display devices can be divided into the bottom emission type, the top emission type and the inverted top emission type according to the light emitting direction and structure. The bottom emission type OLED display device includes a bottom substrate, an anode, an organic material layer, a cathode and a top substrate sequentially disposed. As the light emitted by the organic material layer of the bottom emission type OLED display device passes through the bottom substrate on which several thin film transistors are disposed, the aperture ratio of the bottom emission type OLED display device decreases due to the blockage of the thin film transistors.

To avoid the decrease in the aperture ratio, the top emission type OLED display device further includes a reflection layer disposed on the anode, and the cathode is made of a light-pervious material. Thus, the light emitted by the organic material layer of the top emission type OLED display device can be reflected by the reflection layer, so that the light is projected towards the top substrate in which no thin film transistor is disposed, hence avoiding the decrease in the aperture ratio. However, a cathode made of a light-pervious material often has an inferior electron injection effect which further affects the display effect.

In addition, the top emission type OLED display device is a cathode common structure, wherein the anode of the top emission type OLED display device is electrically connected to the thin film transistors. When the voltage applied to the cathode common OLED display device increases, the driving voltage of the thin film transistors is affected to become unstable. The inverted top emission type OLED display device is an anode common structure, wherein the cathode of the inverted top emission type OLED display device is electrically connected to the thin film transistors. The inverted top emission type OLED display device, being an anode common structure, can avoid the driving voltage of the thin film transistors being affected by the voltage applied to the OLED display device. However, the anode of the inverted top emission type OLED display device needs to be formed on the organic material layer by way of sputtering. As a result, the organic material layer may be sputtered and damaged during the manufacturing process, hence affecting the light emitting effect.

SUMMARY OF THE INVENTION

The invention is directed to an organic light emitting diode (OLED) display device and a manufacturing method thereof. An active array structure and a display structure are respectively formed and assembled together to form an OLED display device.

According to a first aspect of the present invention, an OLED display device including an active array structure, a display structure and several conductive members is provided. The active array structure includes a first substrate and several thin film transistors. The thin film transistors are disposed on the first substrate and have several drains. The display structure includes a second substrate, a color changing medium, a first electrode layer, an organic material layer and a second electrode layer. The location of the second substrate corresponds to the location of the first substrate. The color changing medium is disposed on the second substrate and has several color blocks. The first electrode layer is disposed on the color changing medium. The organic material layer is disposed on the first electrode for emitting blue light. The organic material layer includes several light-emitting structures electrically insulated from each other. The second electrode layer is disposed on the organic material layer and includes several electrode structures electrically insulated from each other. Each of the conductive members is combined and electrically connected to the drain of each of the thin film transistors and each of the electrode structures. Each of the thin film transistors corresponds to one of the color blocks, one of the light-emitting structures and one of the electrode structures.

According to a second aspect of the present invention, a manufacturing method of an OLED display device is provided. The manufacturing method includes the following steps. Several thin film transistors are formed on a first substrate so as to form an active array structure. Next, a color changing medium, a first electrode layer, an organic material layer and a second electrode layer are sequentially formed on a second substrate so as to form a display structure. The organic material layer is used for emitting blue light. Then, the active array structure and the display structure are combined and electrically connected through several conductive members so as to form an OLED display device.

The invention will become apparent from the following detailed description of the preferred but non-limiting embodiments. The following description is made with reference to the accompanying drawings.

BRIEF DESCRIPTION OF THE DRAWINGS

FIG. 2A shows a sectional view of an active array structure according to a preferred embodiment of the present invention.

FIG. 2B shows a sectional view of a display structure according to a preferred embodiment of the present invention.

DETAILED DESCRIPTION OF THE INVENTION

Figure 1:
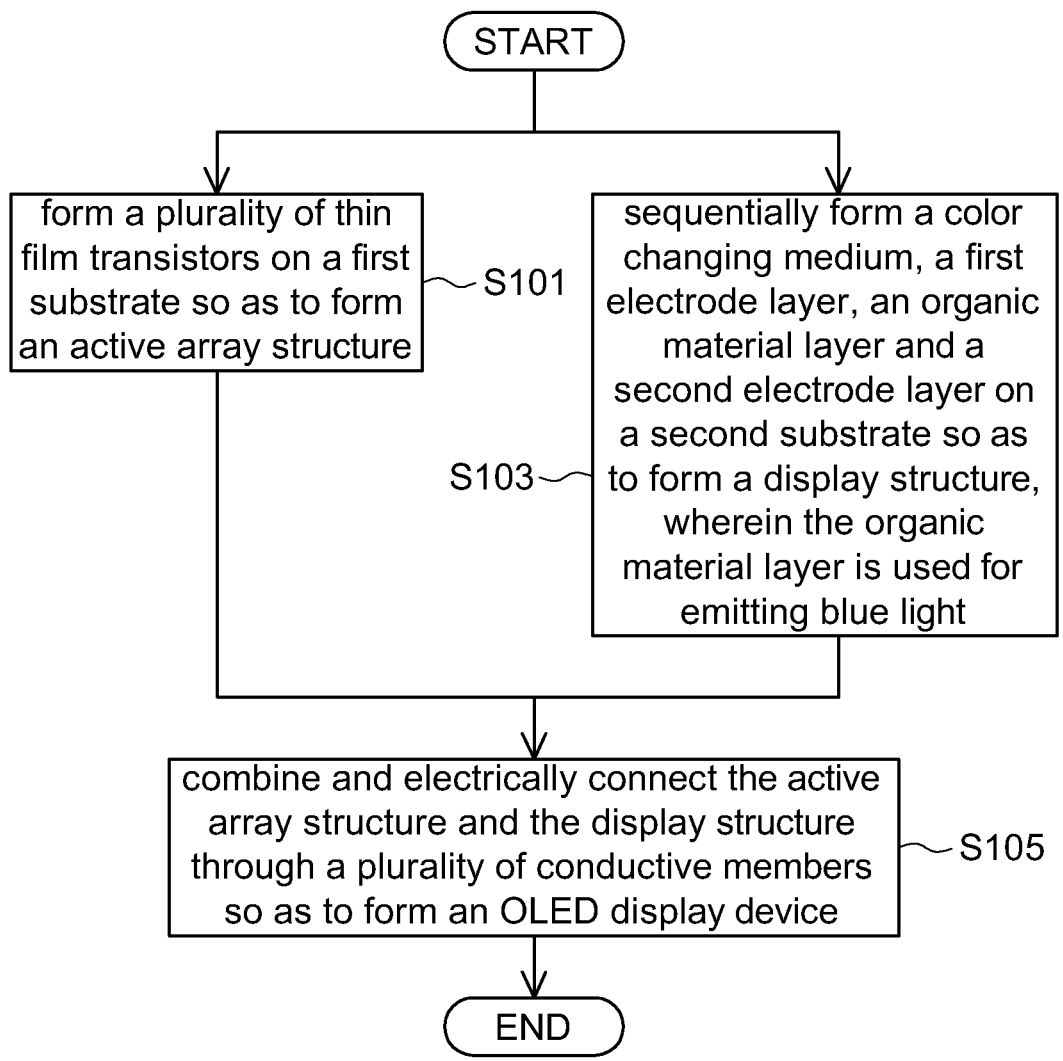
FIG. 1 shows a flowchart of a manufacturing method of an OLED display device according to a preferred embodiment of the present invention.

Referring to FIG. 1 and FIG. 2A, a flowchart of a manufacturing method of an OLED display device according to a preferred embodiment of the present invention is shown in FIG. 1, and a sectional view of an active array structure according to a preferred embodiment of the present invention is shown in FIG. 2A. In the step S101, several thin film transistors (TFT) 213 are formed on a surface of a first substrate 211 so as to form an active array structure 210. The thin film transistors 213 can be poly crystalline silicon thin film transistors, microcrystalline silicon thin film transistors or amorphous silicon thin film transistors.

Referring to FIG. 2B, a sectional view of a display structure according to a preferred embodiment of the present invention is shown. In the step S103, an auxiliary electrode 222, a color changing medium 223, a passivation layer 224, a first electrode layer 225, an organic material layer 227 and a second electrode layer 228 are sequentially formed on a surface of a second substrate 221 so as to form a display structure 220. The organic material layer 227 is composed of multi-layered material structures for emitting blue light.

Figure 2C:
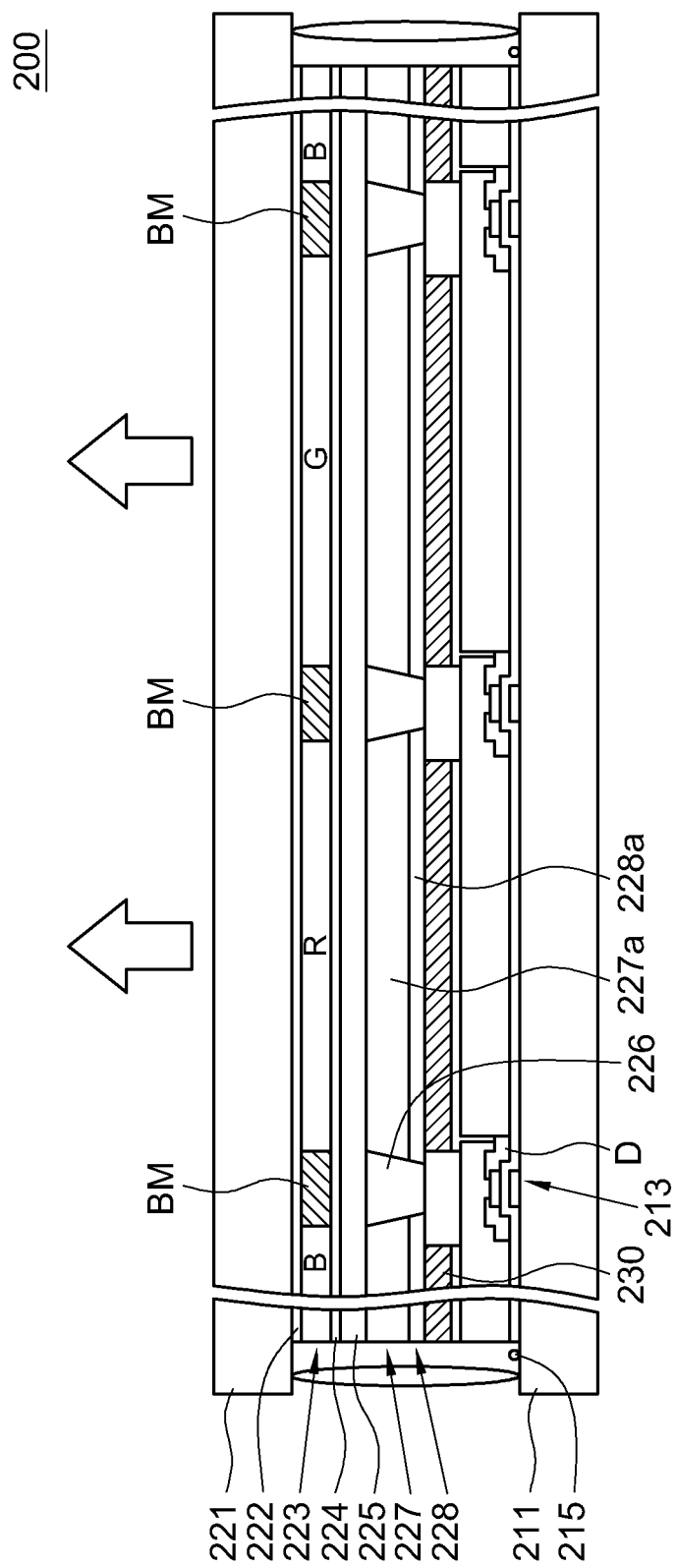
FIG. 2C shows a sectional view of an OLED display device formed by assembling the active array structure in FIG. 2A and the display structure in FIG. 2B.

Referring to FIG. 2C, a sectional view of an OLED display device 200 formed by assembling the active array structure 210 in FIG. 2A and the display structure 220 in FIG. 2B is shown. In the step S105, the active array structure 210 in FIG. 2A and the display structure 220 in FIG. 2B are combined and electrically connected through several conductive members 230 so as to form an OLED display device 200. In the present embodiment of the invention, the conductive members 230 are made of a conductive and adhesive material, such as an anisotropic conductive film, an anisotropic conductive adhesive, a conductive resin, silver paste, or a metal bump. The conductive member 230 can be disposed on the drain D of the thin film transistor 213 of the first substrate 211 or on one of the electrode structures of the second substrate 221 for correspondingly combining the active array structure 210 in FIG. 2A and the display structure 220 in FIG. 2B.

Figure 3:
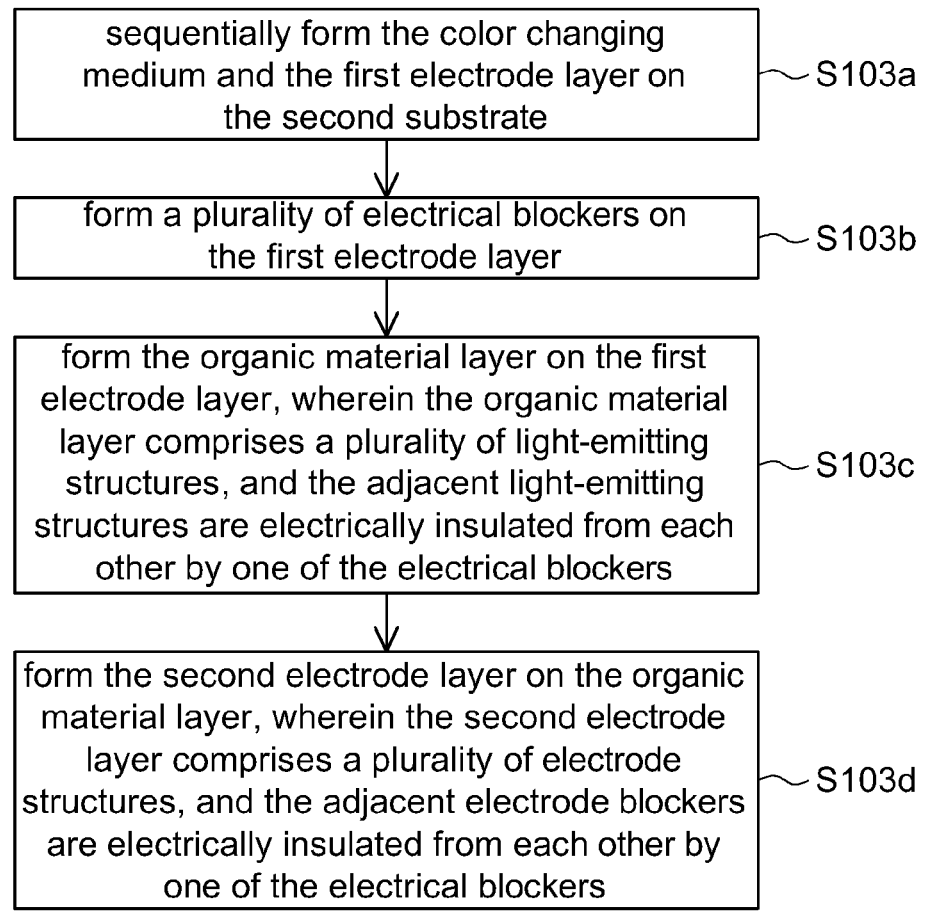
FIG. 3 shows a flowchart of a manufacturing method of the display structure in FIG. 1.

The display structure 220 of the present invention is elaborated. Referring to FIG. 2B and FIG. 3, a flowchart of a manufacturing method of the display structure according to the present invention is shown in FIG. 3. In the step S103a, the auxiliary electrode 222, the color changing medium 223, the passivation layer 224 and the first electrode layer 225 are sequentially formed on the surface of the second substrate 221. The auxiliary electrode 222 can be meshed or bar-shaped. The auxiliary electrode 222 can be made of molybdenum (Mo), chromium (Cr), or the auxiliary electrode 222 can be a molybdenum/aluminum/molybdenum (Mo/Al/Mo) stacking structure. The color changing medium 223 is a structure with a black matrix BM disposed between several red, green, blue (R, G, B) color blocks. The color blocks denoted by R and G are capable of absorbing the blue light emitted from the organic material layer 227 for exciting the internal fluorescent dyes to radiate red light and green light, respectively. The color block denoted by B can be a transparent layer or a hollow structure, so that the blue light emitted by the organic material layer 227 can directly pass through the color block to maintain its original color. Thus, the color changing medium 223 enables the OLED display device 200 to display a full-color frame, and the black matrix BM can be used for avoiding the light leakage occurring at adjacent color blocks. Also, the passivation layer 224 can be made of silicon dioxide ($SiO_2$) for protecting the color changing medium 223 and providing a flat surface. The first electrode layer 225 can be made of indium tin oxide (ITO).

Next, in the step 103b, several electrical blockers 226 are disposed apart on a surface of the first electrode layer 225 which is opposite to the surface of the first electrode layer 225 disposed with the passivation layer 224 thereon, and the electrical blockers 226 correspond to the black matrix BM.

Then, in the step 103c, the organic material layer 227 is disposed on the surface of the first electrode layer 225 between the electrical blockers 226, so that the electrical blockers 226 are used for electrically isolating the organic material layer 227. The organic material layer 227 including a hole transport layer (HTL), an emitting material layer (EML) and an electron transport layer (ETL) emits blue light according to the characteristics of the material of the emitting material layer.

Next, in the step 103d, the second electrode layer 228 is formed on a surface of the organic material layer 227, and a display structure 220 is formed through the steps 103a~103d. The second electrode layer 228 can be made of aluminum and used as a cathode. The second electrode layer 228, like the organic material layer 227, is divided into several areas corresponding to the red, green, blue (R, G, B) color blocks by the electrical blockers 226.

As indicated in FIG. 1 and FIG. 2C, in the step S105, the drain D of the corresponding thin film transistor 213 and the corresponding electrode structure are combined and electrically connected through the conductive member 230 so as to form the OLED display device 200. Preferably, the work function of each conductive member 230 ranges between the work function of the drain D of each thin film transistor 213 and the work function of each electrode structure to reduce the poor contact between different interfaces. In the present embodiment of the invention, the conductive member 230 is made of a conductive and adhesive material, such as an anisotropic conductive film, an anisotropic conductive adhesive, a conductive resin, silver paste, and a metal bump. The conductive member 230 can be disposed on the drain D of the thin film transistor 213 of the first substrate 211 or one of the electrode structures of the second substrate 221 so as to correspondingly combine the active array structure 210 in FIG. 2A and the display structure 220 in FIG. 2B. The combining way can be UV light radiation, thermosetting, heated press-fit, bump press-fitting or other package bonding methods. If the UV light radiation method is selected to set the conductive members 230, only a small portion of the light-pervious area of the second substrate 221 needs to be reserved for the UV light to pass through.

The location of the second substrate 221 of the assembled OLED display device 200 corresponds to that of the first substrate 211, and each thin film transistor 213 corresponds to one color block, one light-emitting structure 227a and one electrode structure.

The OLED display device 200 of the present embodiment of the invention has at least the following advantages. As the thin film transistors 213 can be amorphous silicon thin film transistors, the OLED display device 200 has the features of emitting light uniformly, having low manufacturing cost and being easy to be enlarged. Moreover, the first substrate 211 can be disposed with the thin film transistors 213 thereon. The first substrate 211 can be disposed with the thin film transistors 213 and other compensation circuits thereon to further reduce the manufacturing cost and the processing time.

In addition, despite having high aperture ratio, the conventional top emission type OLED display device still needs a transparent electrode layer and is manufactured by an inverted manufacturing process. Therefore, the conventional top emission type OLED display device may damage the organic layer during the formation of the electrode layer. In contrast, the OLED display device 200 of the present embodiment of the invention has high aperture ratio and does not need to sputter an electrode layer on the organic layer, so the organic layer will not be damaged and the cost for forming the electrode layer can be saved.

Besides, in order to effectively avoid the components of the OLED display device 200 being damaged by mist or oxygen, the manufacturing method of OLED display device 200 can further includes a step of disposing several hygristors 215 on the first substrate 211 to protect the OLED display device 200 prior to the step S105. The conventional top emission type OLED display device has a lid which is merely used for packaging and for stopping the mist. By comparison, the second substrate 221 of the OLED display device 200 can further have a structure such as a color changing medium 223 disposed thereon for providing the features of high aperture ratio, superior light-emitting uniformity, low anode impedance and low manufacturing cost.

Furthermore, as most conventional OLED display devices are directly connected to the thin film transistors, the electrode has large impedance. Thus, the light emitted from the middle and the edge of the panel is not uniform. The OLED display device 200 of the present embodiment of the invention can use the metal with good conductivity (such as molybdenum) as an auxiliary electrode 222 to reduce the anode impedance and increase the light emitting uniformity of the panel.

The blue light emitted from the organic material layer 227 of the OLED display device 200 can achieve full-color effect by passing through the color changing medium 223. Compared with the OLED display device which further needs the light emitting material emitting red light and green light to achieve a full-color frame, the OLED display device 200 of the present embodiment of the invention only uses one light emitting material which has high brightness and emits stable blue light, hence further effectively reducing material cost.

As the organic material layer 227 emits the light towards the second substrate 221 in which no thin film transistor 213 is disposed, the situation that the aperture ratio of the OLED display device 200 decreases due to the blockage by the thin film transistors 213 can be avoided.

Figures 4A, 4B:
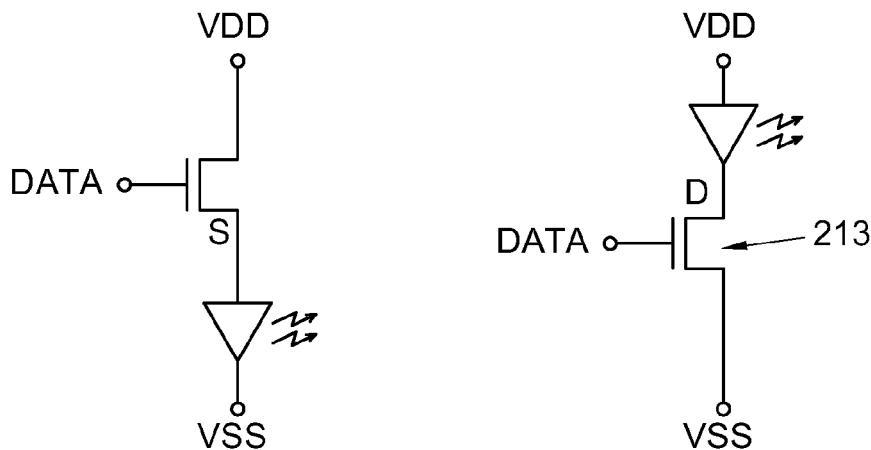
FIG. 4A shows a circuit diagram of a conventional OLED display device being a cathode common structure.
FIG. 4B shows a circuit diagram of the OLED display device in FIG. 2C.

Referring to FIG. 4A, a circuit diagram of a conventional OLED display device being a cathode common structure is shown. The anode of the conventional OLED display device being a cathode common structure is connected to the source S of the thin film transistors. Let the operating voltage of the OLED display device being a cathode common structure be within the range of VDD and VSS as an example. When the driving voltage VDD of the conventional OLED display device being a cathode common structure intends to achieve a target current, the driving voltage VDD is determined according to the voltage of the OLED and the data voltage DATA of the thin film transistors. However, when the data voltage DATA increases, the current and the anode voltage of the OLED increase correspondingly. Thus, the increment in the current is suppressed and hard to control. Referring to FIG. 4B, a circuit diagram of the OLED display device in FIG. 2C is shown. By comparison, the OLED display device 200 is an anode common structure. As the drain D of the thin film transistor 213 of the OLED display device 200 is directly connected to the second electrode layer 228 (cathode) of the display structure 220, the voltage of the thin film transistor 213 will not be affected by the operation of the display structure 220. Under the same driving conditions, the OLED display device 200 has higher brightness and contrast, so the image has superior performance.

According to the OLED display device and the manufacturing method thereof disclosed in the above embodiments of the invention, the active array structure and the display structure are respectively formed, and then the active array structure and the display structure are assembled to form the OLED display device. Thus, the active array structure and the display structure can be tested in advance to detect defected substrates so as to increase the yield rate of the assembled OLED display device.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An organic light emitting diode (OLED) display device, comprising:
    an active array structure, comprising:
    a first substrate; and
    a plurality of thin film transistors disposed on the first substrate and having a plurality of drains;
    a display structure, comprising:
    a second substrate whose location corresponds to that of the first substrate;
    a color changing medium disposed on the second substrate and having a plurality of color blocks;
    a first electrode layer disposed on the color changing medium;
    an organic material layer disposed on the first electrode for emitting blue light, wherein the organic material layer comprises a plurality of light-emitting structures electrically insulated from each other; and
    a second electrode layer disposed on the organic material layer and comprising a plurality of electrode structures electrically insulated from each other;
    a plurality of conductive members, wherein each of the conductive members is combined and electrically connected to the drain of each of the thin film transistors and each of the electrode structures; and
    at least a hygristor distributed between the first substrate and the second substrate;
    wherein, each of the thin film transistors corresponds to one of the color blocks, one of the light-emitting structures and one of the electrode structures.

2. The OLED display device according to claim 1, wherein the thin film transistor is a poly crystalline silicon thin film transistor, a microcrystalline silicon thin film transistor or an amorphous silicon thin film transistor.

3. The OLED display device according to claim 1, wherein the work function of each of the conductive members ranges between the work function of the drain of each of the thin film transistors and the work function of each of the electrode structures.

4. The OLED display device according to claim 1, wherein the active array structure further comprises:
    a plurality of the hygristors distributed on the first substrate.

5. The OLED display device according to claim 1, wherein the display structure further comprises:
    an auxiliary electrode disposed between the second substrate and the color changing medium.

6. The OLED display device according to claim 5, wherein the shape of the auxiliary electrode comprises one of a meshed shape and a bar shape.

7. The OLED display device according to claim 1, wherein the display structure further comprises:
    a passivation layer disposed between the color changing medium and the first electrode layer.

8. The OLED display device according to claim 1, wherein the display structure further comprises:
    a plurality of electrical blocker disposed on the first electrode layer, wherein each of the electrical blockers is located between the two adjacent light-emitting structures and between the two adjacent electrode structures.

9. The OLED display device according to claim 1, wherein the conductive member is made of an anisotropic conductive film, an anisotropic conductive adhesive, a conductive resin, silver paste, or a metal bump.

10. The OLED display device according to claim 1, wherein the organic material layer is composed of multi-layered material structures.

11. A manufacturing method of an OLED display device, comprising:
   (a) forming a plurality of thin film transistors on a first substrate so as to form an active array structure;
   (b) sequentially forming a color changing medium, a first electrode layer, an organic material layer and a second electrode layer on a second substrate so as to form a display structure, wherein the organic material layer is used for emitting blue light;
   (c) combining and electrically connecting the active array structure and the display structure through a plurality of conductive members so as to form an OLED display device; and
   (d) forming at least a hygristor between the first substrate and the second substrate.

12. The manufacturing method of the OLED display device according to claim 11, wherein the step (b) comprises:
   sequentially forming the color changing medium and the first electrode layer on the second substrate;
   forming a plurality of electrical blockers on the first electrode layer;
   forming the organic material layer on the first electrode layer, wherein the organic material layer comprises a plurality of light-emitting structures, and the adjacent light-emitting structures are electrically insulated from each other by one of the electrical blockers; and
   forming the second electrode layer on the organic material layer, wherein the second electrode layer comprises a plurality of electrode structures, and the adjacent electrode structures are electrically insulated from each other by one of the electrical blockers.

13. The manufacturing method of the OLED display device according to claim 12, wherein the step (b) further comprises:
   forming an auxiliary electrode between the second substrate and the color changing medium.

14. The manufacturing method of the OLED display device according to claim 13, wherein the shape of the auxiliary electrode comprises one of a meshed shape and a bar shape.

15. The manufacturing method of the OLED display device according to claim 12, wherein the step (b) further comprises:
   forming a passivation layer between the color changing medium and the first electrode layer.

16. The manufacturing method of the OLED display device according to claim 12, wherein the work function of each of the conductive members ranges between the work function of the drain of each of the thin film transistors and the work function of each of the electrode structures.

17. The manufacturing method of the OLED display device according to claim 12, wherein in the step (c), the drain of one of the thin film transistors and one of the electrode structures are combined and electrically connected through one of the conductive members.

18. The manufacturing method of the OLED display device according to claim 11, further comprising:
   forming a plurality of the hygristors on the first substrate.

19. The manufacturing method of the OLED display device according to claim 11, wherein the step (c) is performed by UV light radiation, thermosetting, compressing, bump press-fitting, or other package bonding methods.

20. The manufacturing method of the OLED display device according to claim 11, wherein the organic material layer is composed of multi-layered material structures.

* * * * *